United States Patent
Matsushima

(10) Patent No.: US 7,435,974 B2
(45) Date of Patent: Oct. 14, 2008

(54) ELECTRON MICROSCOPE AND SPECIMEN STAGE POSITIONING CONTROL METHOD FOR THE ELECTRON MICROSCOPE

(75) Inventor: Masaru Matsushima, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 212 days.

(21) Appl. No.: 11/520,707

(22) Filed: Sep. 14, 2006

(65) Prior Publication Data
US 2007/0057196 A1  Mar. 15, 2007

(30) Foreign Application Priority Data
Sep. 14, 2005 (JP) ............... 2005-266731

(51) Int. Cl.
*H01J 37/20* (2006.01)
(52) U.S. Cl. ................................. 250/442.11
(58) Field of Classification Search ............ 250/442.11, 250/310
See application file for complete search history.

(56) References Cited

U.S. PATENT DOCUMENTS 6,724,466 B2 * 4/2004 Ono et al. ............. 355/72
6,794,660 B2 * 9/2004 Watson ................. 250/492.2
6,882,126 B2 * 4/2005 Watson et al. ............ 318/640

FOREIGN PATENT DOCUMENTS

| JP | 9-166428 | 6/1997 |
| JP | 2002-126964 | 5/2002 |
| JP | 2004-134155 | 4/2004 |

* cited by examiner

*Primary Examiner*—Kiet T Nguyen
(74) *Attorney, Agent, or Firm*—McDermott Will & Emery LLP

(57) ABSTRACT

An electron microscope is disclosed, wherein a specimen stage includes a base having an X-slide guide member, a center table adapted to move along the X-slide guide member, and an X rod for driving the center table. A gap is formed in the coupling between the guide unit of the center table and the X rod. A control unit performs the position control operation to monitor the measurement of a position detector such as a laser interferometer, stop driving the center table at a designated stop position, and separate the table and the X rod from each other using the gap.

6 Claims, 3 Drawing Sheets

ELECTRON MICROSCOPE AND SPECIMEN STAGE POSITIONING CONTROL METHOD FOR THE ELECTRON MICROSCOPE

BACKGROUND OF THE INVENTION

This invention relates to an electron microscope and a specimen stage positioning control method for the electron microscope suitably used for inspection and evaluation of a semiconductor in the semiconductor fabrication field.

With the recent micronization of semiconductor elements, the inspection and evaluation apparatuses as well as the fabrication apparatus thereof have been required to be correspondingly higher in accuracy. Normally, in order to evaluate whether the shape and size of a pattern formed on a semiconductor wafer are correct or not, a scanning electoron microscope having a critical dimension measuring function (hereinafter referred to as the critical dimension measuring SEM) is used.

In the critical dimension measuring SEM, an electron beam is radiated on a wafer and the secondary electron signal obtained is subjected to image processing, and from the change in contrast thereof, a pattern edge is discriminated thereby to determine the size (see, for example, JP-A-9-166428, paragraphs "0012" to "0016", FIG. 4).

For this reason, in order to keep up with the design rule of 35 nm node, it has become a critical subject to obtain a secondary electron image of fewer noises in the magnification of not less than 300 thousands for observation. Also, in order to improve the contrast by superposing a number of images one on another, the vibration and drift of nm order of the stage on which the wafer is mounted and held are required to be suppressed.

In the critical dimension measuring SEM, the wafer evaluated is returned to the fabrication line, and therefore, the wafer cannot be split into small segments. The evaluation of the whole wafer surface, therefore, requires a wafer stage having a sufficient stroke to make the evaluation possible.

Presently, the main size of the wafer employed is 300 nm, which considerably increases the size of the stage used with it. At the same time, from the viewpoint of improving the throughput, a high output drive mechanism for increasing the stage speed is required, which in turn generates heat in the drive shaft of the motor, resulting in a temperature increase.

As a conventional means for avoiding the table drift due to thermal expansion and compression, what is called the servo control technique is available in which the stage position is monitored in real time and the result of monitoring the table behavior is fed back to determine the motor control amount and the electron beam deflection amount (see, for example, JP-A-2002-126964, paragraphs "0005" to "0016")

Controlling the position of the stage and the electron beam on the nm order, however, requires a system for measuring the stage position with high resolution at high speed, a servo circuit and a servo motor for performing the servo control operation and the adjustment thereof, thereby leading to a system complication and an increased apparatus cost. Also, in the servo control operation, a minor vibration is generated even in stationary state, which may vibrate the whole apparatus and affect the secondary electron image.

To cope with this problem, a technique has been conceived in which a gap of 20 μm to 100 μm is formed between the movable table and the drive shaft which is separated while in stationary state (see, for example, JP-A-2004-134155, paragraphs "0007" to "0011"). According to this technique, the control operation by an open loop using a pulse motor is possible.

According to the technique disclosed in JP-A-2004-134155 employing the structure having a gap in the drive unit, however, a dead zone like the backlash of a gear occurs and a smooth fine feed becomes difficult. In the case where the movement over a distance shorter than the gap, therefore, the gap is sided in one direction by provisional movement over a long distance, after which the control operation is performed for fine feed toward a target position. As a result, a longer time is required to reach the target position, thereby giving rise to a new problem of a reduced throughput.

SUMMARY OF THE INVENTION

This invention has been achieved to solve the problem described above, and the object of the invention is to provide an electron microscope and a specimen stage positioning control method for the electron microscope having an inexpensive specimen stage mounted thereon, in which the moving time of fine feed is not increased and the noises due to the thermal drift and vibration during the stationary state of the stage can be suppressed.

In order to solve the problem described above, according to this invention, a gap is formed in the coupling between the drive unit such as a ball screw for driving the table and the table, and the difference between the measurement of a position detector and a preset target value is monitored during the fine feed operation, while once the difference with the target position is reduced below a predetermined value, the driving of the table is stopped and the position thereof controlled. Further, after the table stops, the drive shaft is separated utilizing the gap in the coupling by the position control operation.

According to this invention, there are provided an electron microscope and a specimen stage positioning control method for the electron microscope having a specimen stage mounted thereon, which can be moved at high speed in long distance feed mode, while in fine feed mode, the table drive is stopped while monitoring the difference between the measurement value by the position detector and a preset target value. Therefore, the wasteful feed control operation conscious of the gap is eliminated and the positioning operation is made possible in a short time. In spite of the employment of an inexpensive, simple open loop control, therefore, the movement time is not increased even in fine feed mode, and the noises due to the thermal drift and vibrations can be suppressed while the stage is stationary.

Other objects, features and advantages of the invention will become apparent from the following description of the embodiments of the invention taken in conjunction with the accompanying drawings.

DETAILED DESCRIPTION OF THE INVENTION

With reference to FIGS. 1 to 4, an electron microscope and a specimen stage positioning control method for the electron microscope according to an embodiment of the invention are explained in detail below.

Figure 1:
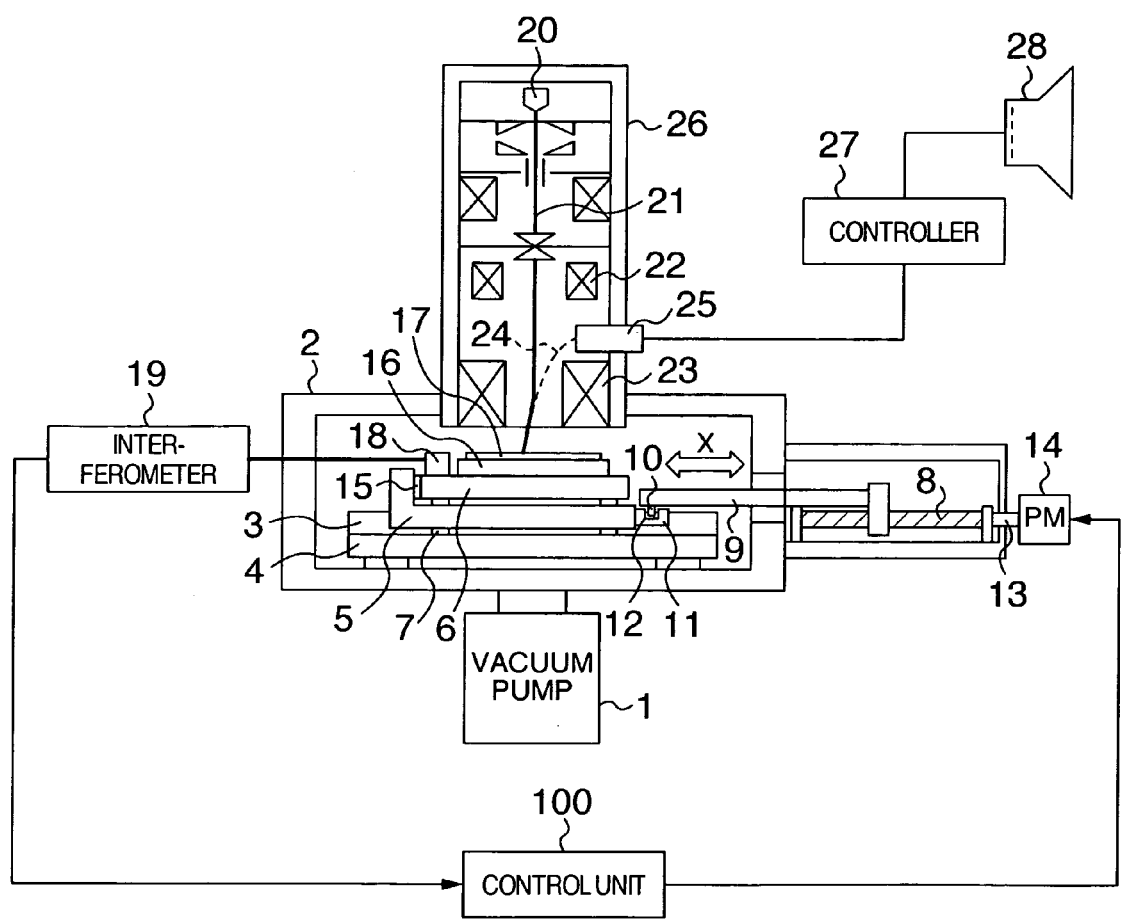
FIG. 1 is a diagram showing a general configuration of an electron microscope according to an embodiment of the invention.

FIG. 1 is a diagram showing a general configuration of an electron microscope according to an embodiment of the invention. This diagram illustrates a critical dimension measuring SEM with a specimen stage mounted thereon.

In FIG. 1, a specimen stage 3 is mounted in a specimen chamber 2 that can be vacuumized by a vacuum pump 1. The specimen stage 3 includes a base 4, a center table 5 and a top table 6. The center table 5 is restricted in motion by an X-slide guide member 7 as a motion guide on the base 4, and movable in one direction (in X direction (leftward and rightward in FIG. 1)). The center table 5 is also pushed and pulled by an X rod 9 adapted for linear motion by the rotation of an X ball screw 8 as a drive mechanism. A gap 12 of 50 μm is formed between a guide unit 11 of the center table 5 and a pin 10 at the forward end of the X rod 9. The X ball screw 8 is coupled to a shaft 13 sealed by vacuum and can be rotated by a pulse motor (PM) 14.

Also, a Y-slide guide member 15 is arranged at right angles to the X-slide guide member 7 on the center table 5. The top table 6 is adapted to move in one direction (Y direction, i.e. the direction perpendicular to the page) along the Y-slide guide member 15. The top table 6 and the Y rod are coupled to each other, like the center table 5, with a gap formed between the pin at the forward end of the Y rod and the guide unit. None of the Y rod, the pin, the guide unit and the gap described above is shown in the drawings.

A specimen holder 16 is mounted on the top table 6, and a wafer 17 is fixed on the specimen holder 16. Also, a bar mirror 18 for controlling the stage position is mounted on the top table 6 to measure the position using a position detector such as a laser interferometer (referred to as "the interferometer" in FIG. 1) 19.

A control unit 100, based on the position of the specimen stage 3 measured by the laser interferometer 19, controls the PM 14 thereby to control the stage position in X and Y directions.

The control unit 100 functions as "the control means" described in the appended claims in collaboration with the laser interferometer 19, or specifically, includes a microprocessor for reading the program recorded in a built-in memory and sequentially executing the processes according to the flowchart of FIG. 2 described later.

A column 26 having built therein an electron gun 20 providing an electron beam source, a deflection coil 22 for changing the trajectory of an electron beam 21, an objective lens 23 for converging the electron beam 21 and a secondary electron detector (a photomultiplier) 25 for retrieving the secondary electrons 24 radiated from the wafer 17 is mounted on the specimen chamber 2. The signal of the secondary electron detector 25 is processed by a controller 27, and sent to a CRT (cathode ray tube) for observation.

Now, the operating principle of the electron microscope according to an embodiment of this invention having the above-mentioned configuration is explained. Normally, as a method of evaluating the wafer pattern shape, the user registers, using the coordinate, (1) a particular position in which the desired pattern is located in a chip, and (2) a particular chip of which the pattern is evaluated among the chips arranged in a wafer.

At the time of evaluation, the control unit 100, based on the registered information, moves the specimen to the particular coordinate automatically, after which the electron beam 21 is radiated on the wafer 17 and scanned by a deflection coil 22, so that a secondary electron image several tens of thousands to several hundreds of thousands times as large is acquired and displayed on the CRT 28. From the contrast change of this secondary electron image, the pattern shape is determined and the dimensional value of the designated shape (pattern line width, pitch, etc.) is calculated. After that, the specimen stage is moved to the coordinate position of the chip next registered and an image is similarly acquired repeatedly.

Figure 2:
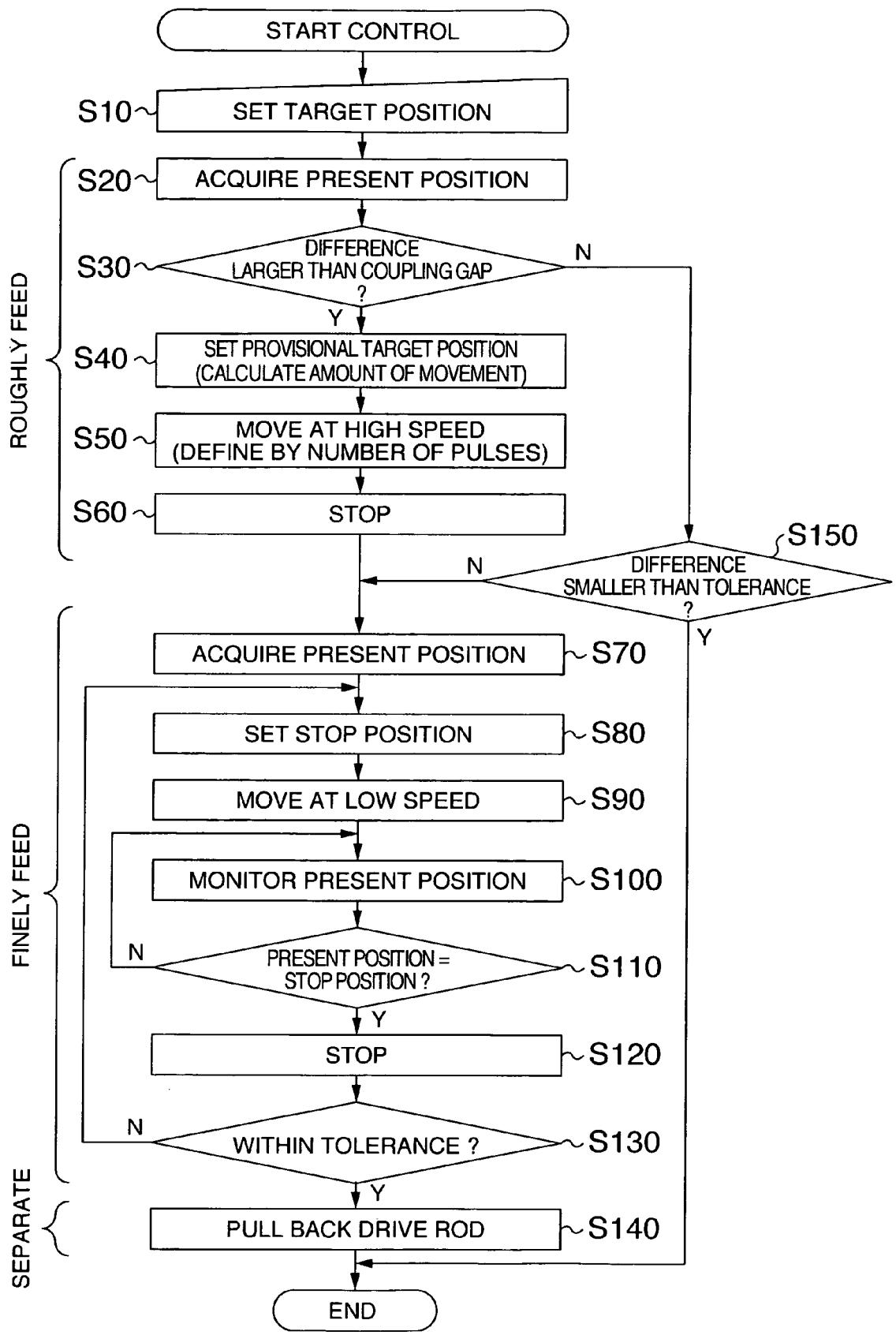
FIG. 2 is a flowchart showing the sequence of executing the specimen stage positioning control for the electron microscope according to an embodiment of the invention.
Figure 3:
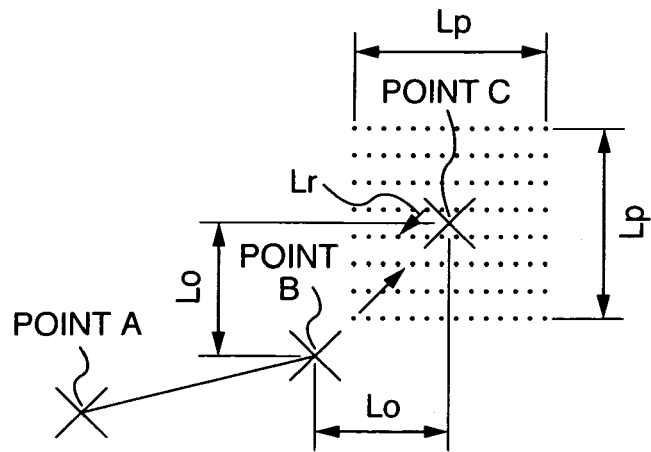
FIG. 3 is a diagram for explaining the specimen stage positioning control method for the electron microscope according to an embodiment of the invention.
Figure 3:
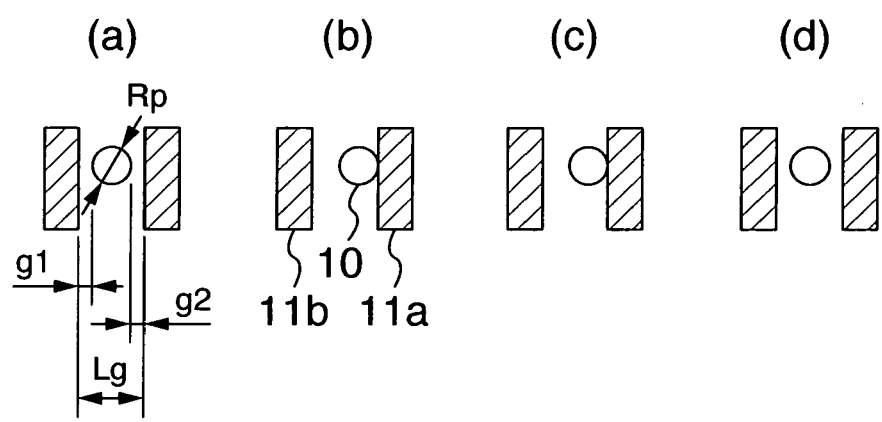

Next, with reference to FIGS. 2 and 3, the specimen stage positioning control method for the electron microscope according to an embodiment of the invention is explained in detail.

FIG. 2 is a flowchart showing the sequence of executing the specimen positioning control method for the electron microscope according to an embodiment of the invention. FIG. 3 is a diagram for explaining the specimen stage positioning control method for the electron microscope according to an embodiment of the invention.

According to the flowchart shown in FIG. 2, first, a target position is set in step S10. Specifically, a target value such as point C in FIG. 3 is determined by designating a stage coordinate in registration or by the apparatus operator designating a coordinate value manually or through a cursor.

Next, in step S20, the control unit 100 detects the present position of the specimen stage 3, or point A in FIG. 3, using the laser interferometer 19.

The control unit 100 determines the error from the difference between the target position and the present position, and determines the operation control mode by the comparative determination process in steps S30, S150. In step S30, the error and the coupling gap are compared with each other, and in the case where the error is larger than the coupling gap (Y), the process proceeds to step S40. In the case where the error is not larger than the coupling gap (N), on the other hand, the process proceeds to step S150. In step S150, the error and the tolerable range are compared with each other, and in the case where the error is larger than the tolerable range (N), the process proceeds to step S70. In the case where the error is smaller than the tolerable range (Y), on the other hand, the process is ended.

Specifically, the error determined in the manner described above is compared with the gap (coupling gap) 12 of 50 μm formed between the guide unit 11 of the center table 5 and the pin 10 at the forward end of the X rod 9, and in the case where the error is not more than a predetermined tolerable positioning range (Lp of 10 μm, for example, in FIG. 3), the stage is not operated at all. In the case where the error is smaller than the coupling gap 12 (g1+g2 for example, in FIG. 3 and 50 μm,) and out of the tolerable positioning range, on the other hand, the rough feed is determined not necessary, and the process proceeds to the fine feed control in step S70.

Further, in the case where the error is larger than the gap 12 and the long distance feed is carried out, a provisional target position (point B in FIG. 3) for the rough feed control operation is set in step S40. The provisional target position B is located a predetermined amount (offset value Lo) before the target position C as viewed from the present position A. The offset value Lo, which is 30 μm, for example, is preferably adjusted in accordance with the size of the gap 12.

Next, in step S50, the control unit 100 calculates the number of pulses to move to the provisional target position B, and rotates the PM 14 by outputting the pulses along a predetermined change rate and frequency thereby to move the specimen stage 3 at high speed. Upon complete output of all the pulses, the PM 14 is stopped (step S60), and the high-speed rough feed control operation is finished. By this time, the specimen stage 3 has come to the neighborhood of point B, the fine feed control operation is started from step S70 for the remaining distance of several tens of μm.

First, the control unit 100 detects the present position of the specimen stage 3 (the neighborhood of point B in FIG. 3) using the laser interferometer 19, and sets the stop position in step S80. This stop position is set for the purpose of deactivating the control operation at the time point when the particular position is reached, and therefore preferably set before an actually desired stop position taking the force of inertia, the delay of the control system and the delay of the mechanical system and the resulting overrun into consideration. The stop position is set to 3 μm, for example, in the case under consideration, and can be easily determined experimentally in advance.

Next, the specimen stage 3 is operated at a speed (low speed) preset in step S90, and while monitoring the present position in step S100, continues to be moved at low speed until the stop position is reached in step S110 (N).

Once the stop position is reached (Y in step S110), the specimen stage 3 is stopped in step S120, after which step S130 confirms whether the specimen stage 3 is located within ±5 μm of the tolerable range. In the case where the specimen stage 3 is located out of the tolerable range, the process is returned to step S80, and the fine feed control is carried out to set the stop position, while in the specimen stage 3 is located within the tolerable range, on the other hand, the drive shaft (X rod) 9 is separated (pulled back) in step S140.

With reference to FIG. 3, relative positions of the pin 10 and the guide units 11a, 11b are explained. The guide units 11a, 11b form the wall portion of the guide unit 11 (FIG. 1), and a gap 12 (FIG. 1) is formed between the guide units 11a, 11b. The pin 10, upon movement from point A to B to C, changes the state from (a) to (b) to (c). In state (a), the pin 10 is located at point A. In state (b), the pin 10 is located at point B. In state (c), the pin 10 is stopped at point C and displaced due to the thermal expansion/compression of the X rod 9 (FIG. 1) having the pin 10 at the forward end thereof. In state (d), the pin 10 is stopped at point C in the pull-back operation.

Specifically, the simple control operation to move the pin 10 from state (a) to (b) to (c) would cause the pin 10 to contact the guide unit 11a. Therefore, the X rod 9 (FIG. 1) with the pin 10 formed at the forward end thereof is pulled back (step S140), and as shown in (d), the pin 10 and the guide unit 11 are separated from each other.

Thus, a uniform gap (space) is formed on each side of the pin 10 by setting the pull-back amount (Lr in FIG. 3) of the pin 10, i.e. the X rod 9 (FIG. 1) to one half (25 μm in the case under consideration) of the gap (=g1+g2, i.e. the difference between the groove width Lg of the guide unit 11 and the diameter Rp of the pin 10).

According to the embodiment of the invention described above, the X rod 9 is separated from the center table 5. Even in the case where the drive X rod 9 is changed in position due to the temperature increase of the X ball screw 8, therefore, no drift is caused. Also, in view of the fact that the X-slide guide member 7 employs the slide contact system, the braking force due to friction works. Even in the case where the X rod 9 is separated, therefore, a stable stationary state can be set. Although the aforementioned embodiment of the invention refers to the positioning control of the specimen stage 3 only in X direction, a similar specimen positioning control in Y direction is possible and not explained to avoid the duplication.

Also, according to the embodiment of the invention described above, the specimen stage is moved at high speed to a point before the target position followed by a fine feed over the remaining distance. Thus, the specimen stage can be set in position within a short time without any operation loss. With an inexpensive, simple open loop control using no servo control, therefore, a secondary electron image with substantially no image quality deterioration due to drifts and vibrations can be obtained without adversely affecting the throughput.

The parameters for the positioning operation include (1) an offset value for setting a provisional target value, (2) an offset value for setting the stop position in fine feed mode, and (3) a pull-back amount after entering a tolerable value, which are set to (1) 30 μm, (2) 3 μm and (3) 25 μm, respectively, in the case under consideration. These three parameters are typical values associated with the coupling gap of 50 μm between the rod and the table and the tolerable value of ±5 μm for the positioning operation, and according to the invention, different values can be employed with equal effect.

Although the offset value in (1) above can be set to 0, i.e. a value as near to the target value as possible can be attained by rough feed, the high-speed stage is fed at high speed and therefore, when stopped, may be displaced under the force of inertia due to the reaction. Thus, the gap shown in (b) of FIG. 3 may not be successfully formed. After entering the tolerable value, therefore, no predicted gap may not be formed in the direction of rod movement in the rod pull-back operation, so that the pin 10 may not come into contact with the guide unit 11b in position.

In the low-speed fine feed mode, on the other hand, the pin 10 always stops by coming into contact with the guide member 11a, and therefore the gap in the pull-back direction can always be secured advantageously. Therefore, the offset value of (1) can be effectively entered (a provisional target position can be set).

Next, the specimen stage braking mechanism mounted on the electron microscope according to an embodiment of the invention is explained with reference to FIG. 4.

Figure 4:
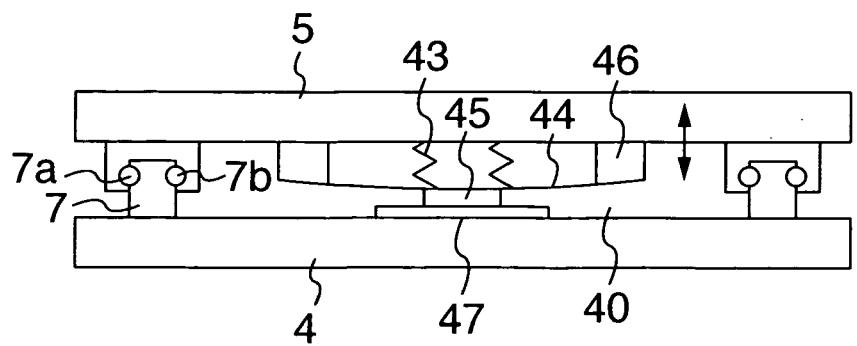
FIG. 4 is a side view for explaining a configuration of the specimen stage of the electron microscope according to an embodiment of the invention.

FIG. 4 is a side view showing an example of a configuration of the specimen stage mounted on the electron microscope according to an embodiment of the invention.

As shown in FIG. 4, a rolling surface 47 and two roll members 7a, 7b having no braking mechanism are arranged on a base 4 making up the specimen stage 3 (FIG. 1). A center table 5 is arranged on the roll members 7a, 7b. The center table 5 has such a structure as to move linearly along the roll members 7a, 7b. A braking mechanism 40 utilizing the elasticity of a spring is arranged at the central portion of the center table 5.

The braking mechanism 40 is configured of a compression coil spring 43, a leaf spring 44 and a sliding member 45. The spring plate 44 is mounted by a fixing unit 46 at the central portion of the center table 5, and the sliding member 45 is mounted under the central portion of the spring plate 44. Also, the compression coil spring 43 is built in on the upper side of the spring plate 44, so that the horizontal motion of the sliding member 45 is restricted by the spring plate 44, while a vertical force is kept applied by the coil spring 43 to the rolling surface 47 of the base 4 thereby to secure the braking force.

As a result, the specimen stage 13 high in positioning accuracy with a small drift can be configured without using the sliding guide member 7 on the center table 5.

Although the embodiment of the invention described above refers only to the braking mechanism 40 between the base 4 and the center table 5, a similar braking mechanism may be added between the center table 5 and the top table 6 with equal effect.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electron microscope comprising a specimen stage including a base including a motion guide, a table adapted to move along the motion guide, a drive mechanism for driving the table and a position detector for measuring the table position,
   further comprising a control means for forming a gap in the coupling between the table and the drive mechanism, monitoring the difference between the measurement of the position detector and a preset target value, performing the position control operation to stop driving the table in accordance with the value of the difference, and performing the position control operation to separate the table and the drive mechanism from each other through the gap after the table stops.

2. The electron microscope according to claim 1, wherein the control means finely feeds the table at low speed until the difference with the target value reaches a predetermined value, followed by stopping the table, in the case where a predicted distance from the table position before movement to a target position is not larger than the gap in the coupling, and roughly feeds the table in accordance with the predicted distance not dependent on the difference in the case where the predicted distance is larger than the gap in the coupling.

3. The electron microscope according to claim 1, wherein the motion guide of the specimen stage includes a rolling surface and a roll member, and the table linearly moved along the roll member includes a braking mechanism for securing the braking force.

4. The electron microscope according to claim 1, wherein a motion guide adapted to move in the direction perpendicular to the direction of movement of the table is arranged on the table, a second table is mounted on the motion guide for two-dimensional movement, a gap is formed in the coupling between the second table and the drive mechanism for driving the second table, and the control means performs the position control operation so that the mounted second table and the drive mechanism are separated from each other during the time when the mounted second table is stationary.

5. A specimen stage positioning control method for an electron microscope comprising a specimen stage including a base having a motion guide, a table adapted to move along the motion guide, a drive mechanism for driving the table and a position detector for measuring the position of the table,
   wherein a control unit for controlling the position of the specimen stage executes the processes of:
   monitoring the difference between the measurement by the position detector and a preset target value;
   performing the position control operation to stop the table in accordance with the difference value; and
   performing the position control operation to separate the table and the drive mechanism from each other by a gap formed in the coupling between the table and the drive mechanism after stopping the table.

6. The specimen stage positioning control method for the electron microscope according to claim 5,
   wherein the position control operation to stop the specimen stage is performed in such a manner that:
   in the case where the predicted distance from the position of the table before movement to the target position is not larger than the gap in the coupling, the specimen stage is moved at low speed before the difference with the target value reaches a predetermined value, after which the table is finely fed to stop, and
   in the case where the predicted distance is larger than the gap in the coupling, the specimen table is roughly fed in accordance with the predicted distance without regard to the difference.

* * * * *